United States Patent [19]

Hatayama et al.

[11] Patent Number: 5,290,835
[45] Date of Patent: Mar. 1, 1994

[54] ELECTRICAL AND ELECTRONIC PARTS FORMED OF POLYBUTYLENE NAPHTHALENEDICARBOXYLATE

[75] Inventors: Toshio Hatayama; Mie Sasaki; Takeshi Kojima; Yoshinari Ogawa, all of Sagamihara; Sakae Shimotsuma, Atsugi; Kouichi Sakai, Sagamihara, all of Japan

[73] Assignee: Teijin Limited, Osaka, Japan

[21] Appl. No.: 964,251

[22] Filed: Oct. 21, 1992

[30] Foreign Application Priority Data

Oct. 1, 1991 [JP] Japan .................. 3-313104
Oct. 28, 1991 [JP] Japan .................. 3-307187
Jan. 29, 1992 [JP] Japan .................. 4-014084

[51] Int. Cl.$^5$ .................. C08K 5/15; C08K 3/10; C08K 3/40
[52] U.S. Cl. .................. 524/109; 524/114; 524/410; 524/411; 524/499; 524/546
[58] Field of Search .............. 524/109, 114, 410, 411, 524/494, 546

[56] References Cited

U.S. PATENT DOCUMENTS

| | | | |
|---|---|---|---|
| 3,374,187 | 3/1968 | Hare et al. | 524/114 |
| 3,674,812 | 7/1972 | Gibbons | 524/114 |
| 3,886,104 | 5/1975 | Borman et al. | 524/114 |
| 3,961,008 | 6/1976 | Kuratsuji et al. | 264/178 R |
| 4,170,711 | 10/1979 | Orlando et al. | 524/109 |
| 4,276,208 | 6/1981 | Ogawa et al. | 524/114 |
| 4,385,144 | 5/1983 | Jones et al. | 524/114 |
| 4,456,719 | 6/1984 | Yamamoto et al. | 524/114 |
| 4,666,972 | 7/1985 | Kohler et al. | 524/504 |
| 4,713,407 | 12/1987 | Bailey et al. | 524/109 |
| 4,814,366 | 3/1989 | Hirahara et al. | 524/109 |
| 5,162,412 | 11/1992 | Liu | 524/114 |

FOREIGN PATENT DOCUMENTS

| | | |
|---|---|---|
| 0039214 | 11/1981 | European Pat. Off. |
| 0466481 | 1/1992 | European Pat. Off. |
| 0506227 | 9/1992 | European Pat. Off. |
| 0074116 | 6/1981 | Japan .................. 524/114 |
| 3-149254 | 6/1991 | Japan .................. 524/114 |

OTHER PUBLICATIONS

JP-A-3 170 546, Chemical Patents Index, Teijin Chemicals KK, 24 Jul. 1991. (Abstract only).
JP-A-63 039 955, Chemical Patents Index, Toray Ind. Inc., 20 Feb. 1988. (Abstract only).
JP-A-61 285 250, Database WPIL, Toray Ind. Inc., Dec. 1986. (Abstract only).
JP-A-61 160 224, Database WPIL, Dia Foil KK, 19 Jul. 1986. (Abstract only).

Primary Examiner—Kriellion S. Morgan
Attorney, Agent, or Firm—Sherman and Shalloway

[57] ABSTRACT

An electrical or electronic part having excellent resistance to moist heat, such as a coil bobbin, a condenser case, an IC carrier, a plug, a socket or a fuse case, formed from a polybutylene naphthalenedicarboxylate resin as a raw material; and a flame-retardant resin composition and an electrical part therefrom are also provided. The flame-retardant resin composition exhibits high fluidity and forms little burr, and the electrical part has excellent flame retardancy and well-balanced properties.

17 Claims, No Drawings

ELECTRICAL AND ELECTRONIC PARTS FORMED OF POLYBUTYLENE NAPHTHALENEDICARBOXYLATE

DETAILED DESCRIPTION OF THE INVENTION

The present invention relates to electrical and electronic parts produced from polybutylene naphthalenedicarboxylate (sometimes referred to as PBN hereinafter) resin as a raw material, and a PBN-containing flame-retardant resin composition free from burr formation. More specifically, it relates to electrical and electronic parts having excellent resistance to moist heat; an electrical part having excellent flame retardancy and well-balanced properties, being formed from a raw material which generates and causes little decomposition gas when molded and used as an electrical part and which therefore causes little contamination on a mold and having high reliability; and a PBN-containing flame-retardant resin composition free from burr formation.

In the field of electrical and electronic parts, synthetic resins are widely used as sealing materials and packaging materials for maintaining their electrical insulation properties, protecting them from outer forces, and preventing a decrease in the characteristic properties under the influence of ambient atmosphere. Polybutylene terephthalate (hereinafter referred to as PBT) and polyethylene terephthalate (hereinafter referred to as PET) are widely used in this field owing to their excellence in rigidity, heat resistance, self-extinguishing properties, electrical properties, formability and dimensional stability. However, these electrical and electronic parts are used for various purposes and usages, and tend to be used in severe environments. It is therefore required to improve PBT and PET accordingly.

The defect with PBT and PET is that these are liable to undergo hydrolysis under high temperature and high humidity due to ester bonds in their main chain, while it is known that decreasing the concentration of carboxyl groups in the terminals of PBT and PET is an effective as means of improving their resistance to moist heat.

However, the above means is not yet adequate, although it can prevent the deterioration of their properties such as strength as shown by a deterioration test using hot water. Therefore, electrical and electronic parts formed of PET and PBT show an immense decrease in their useful life and reliability in some environments where they are used.

Electrical and electronic parts are generally imparted with flame retardancy by incorporating an organic halogen-containing flame retardant and preferably, further a flame retardant aid to their materials.

However, when a flame retardant and a flame retardant aid are incorporated into PET and PBT in large amounts to provide flame retardancy, the flame retardant and flame retardant aid not only decompose to form decomposition products, but also accelerate the decomposition of other additives and the decomposition of PET and PBT per se as well. As a result, the decomposition products formed during molding corrode and contaminate a mold, and consequently, deteriorate the dimensional accuracy of a molded article and processing efficiency. Further, during use of the molded articles, the decomposition products corrode and contaminate a metal being in contact or close to a molded article to impair the function of a part. For example, when a molded article is used in electrical and electronic parts having a metallic electrical contact (e.g., as a housing or substrate for a relay or a switch), the decomposition products may contaminate a contact-forming metal during the use of the part for a long time to greatly increase the electric resistance value of the contact and finally render the contact electrically not conductive.

Further, in recent years, with electrical and electronic parts such as a switch, a connector and a relay being decreased in the size and thickness, the requirement concerning the properties of resins is becoming severe. Namely, resins are required not only to give electrical and electronic parts excellent in mechanical and electrical properties but also to be excellent in properties like high fluidity, low generation of volatile gas, high dimensional accuracy and low burr formation.

For imparting these functions to resin compositions, it is important to select additives suitable for such purposes. Among additives, in particular, a flame retardant is one of additives which are added in a relatively large amount and have a great influence on the properties of resin compositions. A bromine-containing flame retardant having a high molecular weight is at present used for aromatic polyester resin compositions. If largely classified, the bromine-containing flame retardant is classified into four flame retardants such as a brominated bisphenol A type polycarbonate resin, a brominated bisphenol A type epoxy resin, a brominated polystyrene resin and a brominated polyphenylene ether resin. Among these flame retardants, a brominated bisphenol A type epoxy resin having a low melting point is used in many cases for imparting resin compositions with high fluidity. Although there is an improvement in the fluidity, there is almost no effect on prevention of burr formation. It is therefore, desired to develop a PBT resin composition having high fluidity and being free from burr formation.

It is an object of the present invention to provide electrical and electronic parts having excellent resistance to moist heat, formed from a polybutylene naphthalenedicarboxylate as a raw material.

It is another object of the present invention to provide an electrical part which has excellent flame retardancy and well-balanced properties and is formed from a polybutylene naphthalenedicarboxylate which generates little decomposition gas when molded and used as an electrical part, causes little contamination on a mold and has high reliability.

It is further another object of the present invention to provide a flame-retardant polybutylene naphthalenedicarboxylate resin composition which exhibits high fluidity and forms little burr.

Other objects and advantages of the present invention will be apparent from the following description.

According to the present invention, the above objects and advantages of the present invention are achieved, first, by an electrical or electronic part formed from a polybutylene naphthalenedicarboxylate resin as a raw material.

In the present invention, the polybutylene naphthalenedicarboxylate resin refers to a polyester having naphthalenedicarboxylic acid, preferably naphthalene-2,6-dicarboxylic acid, as a main acid component and 1,4-butanediol as a main glycol component, i.e., a polyester in which all or most (generally at least 90 mol %, preferably at least 95 mol %) of the recurring units are butylene naphthalenedicarboxylate. Preferred is polybutylene-2,6-naphthalenedicarboxylate.

Further, for producing the above polyester, dicarboxylic acids other than naphthalenedicarboxylic acid, glycols other than 1,4-butanediol, oxycarboxylic acid and polyfunctional compounds having at least three functional groups may be used as comonomers in such an amount that the physical properties of the polyester are not impaired. That is, examples of the acid component include aromatic dicarboxylic acid other than naphthalenedicarboxylic acid such as phthalic acid, isophthalic acid, terephthalic acid, diphenyldicarboxylic acid, diphenyletherdicarboxylic acid, diphenoxyethanedicarboxylic acid, diphenylmethanedicarboxylic acid, diphenylketonedicarboxylic acid and diphenylsulfidedicarboxylic acid, aliphatic dicarboxylic acids, e.g., succinic acid, adipic acid and sebacic acid, and alicyclic dicarboxylic acids, e.g., cyclohexanedicarboxylic acid, tetralindicarboxylic acid and decalindicarboxylic acid.

Examples of the glycol component include ethylene glycol, propylene glycol, trimethylene glycol, hexamethylene glycol, octamethylene glycol, neopentyl glycol, cyclohexanedimethanol, xylylene glycol, diethylene glycol, polyethylene glycol, bisphenol A, catechol, resorcinol, hydroquinone, dihydroxydiphenyl, dihydroxyldiphenyl ether, dihydroxydiphenylmethane, dihydroxydiphenylketone, dihydroxydiphenylsulfide and dihydroxydiphenylsulfone.

Examples of the oxycarboxylic acid include oxybenzoic acid, hydroxynaphthoic acid, hydroxydiphenylcarboxylic acid and ω-hydroxycaproic acid.

Examples of the compound having at least three functional groups include glycerin, trimethylpropane, pentaerythritol, trimellitic acid and pyromellitic acid.

The above polyester is produced by polycondensing naphthalenedicarboxylic acid and/or its functional derivative and butylene glycol and/or its functional derivative according to a conventional method for producing aromatic polyesters. Although not specially limited, it is preferred that the concentration of the terminal carboxyl groups of PBN used in the present invention is low.

The concentration of the terminal carboxyl groups can be decreased, for example, by employing a solid phase polymerization method, by adding an alkali (metal) compound when PBN is polymerized, by solid phase polymerization PBN containing an alkali (metal) compound, or further by adding to PBN a compound having a functional group such as an epoxy group or an isocyanate group reactive with a carboxyl group.

The PBN resin used in the present invention may optionally contain other additives such as a stabilizer, a colorant, an ultraviolet light absorber, a mold releasing agent, an antistatic agent, a crystallization promoter, a crystal nucleating agent, a filler and an impact improver, flame retardants such as brominated epoxy, brominated polycarbonate, brominated polystyrene and brominated imide, and flame retardant aids such as antimony trioxide and antimony pentoxide. These additives are used in such amounts that the properties of the PBN resin are not impaired.

The electrical and electronic parts of the present invention can be easily produced from the PBN resin according to a molding method known per se, such as a die molding method, an injection molding method and an extrusion molding method.

The electrical and electronic parts of the present invention include all that come under electrical and electronic parts required to have resistance to moist heat, and examples thereof include a transistor, a condenser, a switch, an IC carrier, a plug, a socket, a fuse case and the like. Above all, the present invention is particularly suitably applied to a coil bobbin used in a transformer and a switch, a condenser case and an IC carrier.

The electrical and electronic parts formed from PBN resin, provided by the present invention, have remarkably improved heat resistance as compared with those formed from conventional PBT resin.

A study of the present inventors has revealed that the PBN resin particularly containing the above-described brominated flame retardant and flame retardant aid causes little contamination on a mold, and gives electrical parts having excellent flame retardancy and well-balanced properties, making remarkably little generation of a decomposition gas when molded and used as electrical parts, and having high reliability.

According to the present invention, therefore, there is provided an electrical part formed from a resin composition as a raw material, which comprises (A) a polybutylene naphthalenedicarboxylate resin, (B) a brominated flame retardant, and (C) a flame retardant aid composed mainly of at least one of antimony trioxide and antimony pentoxide.

The polybutylene naphthalenedicarboxylate resin (A) is selected from the foregoing resins.

Examples of the brominated flame retardant (B) preferably include a brominated bisphenol A type polycarbonate flame retardant having a bromine content of at least 20%, a brominated bisphenol A type epoxy resin and/or a modified product prepared by blocking all or part of the terminal glycidyl groups thereof, a brominated diphenyl ether flame retardant, a brominated imide flame retardant and a brominated polystyrene flame retardant. The content of the brominated flame retardant (B) based on the total weight of the resin composition is preferably not more than 25% by weight, more preferably 2 to 15% by weight.

The flame retardant aid (C) contains at least one of antimony trioxide ($Sb_2O_3$) and antimony pentoxide ($Sb_2O_5$) as a main component. As the flame retardant aid (C), preferred are $Sb_2O_3$ and $xNa_2O \cdot Sb_2O_5 \cdot yH_2O$ ($x=0-1$, $y=0-4$).

The flame retardant aid (C) used in the present invention preferably has a particle diameter of 0.02 to 5 μm. The flame retardant aid (C) may be surface-treated with any one of an epoxy compound, a silane compound, an isocyanate compound and a titanate compound as required. The content of the brominated flame retardant aid (C) based on the total weight of the resin composition is preferably not more than 15% by weight, more preferably 1 to 10% by weight.

PBN itself has high flame retardancy. Therefore, the amount of the above flame retardant and flame retardant aid required for imparting PBN with flame retardancy can be smaller than the amount of these required for imparting PBT and PET with flame retardancy. There is therefore additional effect that the formation of decomposition products of the flame retardant and the flame retardant aid and the formation of decomposition products of other additive and PBN accelerated by the flame retardant and flame retardant aid are remarkably suppressed.

The above resin composition may contain an inorganic filler as required. The inorganic filler is preferably added for obtaining a molded article to exhibit excellent performance in mechanical strength, heat resistance, dimensional stability (resistance to deformation and warpage) and electrical properties. The inorganic filler has the form of a fiber, a powder or particles, or a plate depending upon purposes.

Examples of the fibrous filler include inorganic fibrous materials such as a glass fiber, a carbon fiber, a silica fiber, a silica alumina fiber, a zirconia fiber, a boron nitride fiber, a silicon nitride fiber, a boron fiber, a potassium titanate fiber, and metal fibrous materials of stainless steel, aluminum, titanium, copper and brass. Typical examples of the fibrous filler are a glass fiber and a carbon fiber.

Examples of the powdery or particulate filler include carbon black, silica, powdered silica, glass beads, powdered glass, silicates such as calcium silicate, kaolin, talc, clay, diatomaceous earth and wollastonite, metal oxides such as iron oxide, titanium oxide, zinc oxide and alumina, metal carbonates such as calcium carbonate and barium carbonate, and others such as silicon carbide, silicon nitride, boron nitride and powders of various metals.

Examples of the filler in the form of a plate include mica, glass flakes and foils of various metals.

The above inorganic fillers may be used alone or in combination. The use in combination of a fibrous filler, particularly a glass fiber, and particulate and/or plate-like filler(s) is preferred for imparting a molded article with all of the mechanical strength, dimensional accuracy and electrical properties.

When the above filler is used, it is preferred to use a binder or a surface treating agent as well. Examples of the binder and the surface-treating agent include functional compounds such as an epoxy compound, a silane compound, an isocyanate compound and a titanate compound. The above filler is preliminarily surface-treated or bound before use, or the binder or the surface-treating agent may be simultaneously added at the time of preparation of the resin composition.

The content of the above inorganic filler in the resin composition is not more than 70% by weight, preferably not more than 50% by weight.

In order to impart the desired properties according to the purpose to the molded product, the resin composition may contain other additives such as a stabilizer, a colorant, an ultraviolet light absorber, a mold releasing agent, an antistatic agent, a crystallization promoter, a crystal nucleating agent, a filler and an impact improver. These additives are incorporated in such an amount that the properties of the resin composition are not impaired.

The resin composition of the present invention can be easily produced by means of known facilities and a known method generally used for producing conventional resin compositons. For example, it can be produced by any one of a method (1) in which the components for the resin composition are mixed, melted/kneaded/extruded with an extruder to prepare pellets, and then molding the pellets, a method (2) in which pellets of each component are prepared separately, the pellets of the components are mixed in a predetermined mixing ratio, and the resultant mixture is molded to obtain a molded article having an intended composition, and a method (3) in which one or two components are directly fed to a molding machine. Further, it is preferred to prepare a fine powder from part of resin component(s) and mix the fine powder with remaining components for obtaining a uniformly blended mixture of these components.

Although not limited to a field of articles where gas generation is required to be low, an electrical part formed from the above resin composition as a raw material typically exhibits its highest value when used as a housing of a relay or a bobbin having an electrical contact made of a metal. In the contact portion of a sealed type relay or switch, a gas generated from an internally constituting resin is kept in the contact portion, and the relay or switch sometimes malfunctions due to the gas when used in a high-temperature atmosphere. This malfunction includes two types of failures, and can be evaluated by gas chromatography (GC), an evaluation method of contaminated metal and the quantitative determination of the amount of generated Br. These evaluation methods have shown that the electrical part of the present invention is satisfactorily free of the above malfunction and has high contact reliability.

The above electrical part of the present invention is formed from the above flame-retardant resin composition of the present invention as a raw material. A study of the present inventors has revealed that the present invention can similarly provide a flame-retardant resin composition which has flame retardancy and which also has excellent fluidity and forms little burr.

That is, according to the present invention, thirdly, there is provided a flame-retardant resin composition comprising (A) a resin or a resin mixture selected from a polybutylene naphthalenedicarboxylate resin, a copolyester resin in which the content of the total of a butylene group and a naphthalenedicarboxylate group is at least 60% by weight, and a resin mixture containing at least 60% by weight of polybutylene naphthalenedicarboxylate and a balance of other thermoplastic resin, (B) a brominated epoxy-containing flame retardant, 4 to 25% by weight, (C) a flame retardant aid composed mainly of at least one of antimony trioxide and antimony pentoxide, 2 to 15% by weight, and (D) a polytetrafluoroethylene resin prepared by an emulsion polymerization method, 0.05 to 10% by weight.

The polybutylene naphthalenedicarboxylate resin as the component (A) can be selected from the foregoing resins. That is, the polybutylene naphthalenedicarboxylate includes not only a homopolymer of polybutylene naphthalenedicarboxylate but also a copolymer in which the content of the total of a butylene group (tetramethylene group) and a naphthalenedicarboxylate group

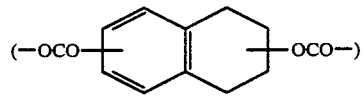

based on the entirety of ester-constituting units is at least 60% by weight, preferably at least 70% by weight.

Further, the component (A) may be a resin mixture containing at least 60% by weight, preferably 70% by weight, of polybutylene naphthalenedicarboxylate and a balance of other thermoplastic resin.

Examples of the above other thermoplastic resin include aromatic polyesters such as polyethylene terephthalate, polyethylene isophthalate, polyethylene naphthalate, polybutylene terephthalate and polycyclohexanedimethanol terephthalate, and other resins such as polycarbonate, nylon 6, nylon 66 and nylon 46.

The component (B) is a brominated epoxy-containing flame retardant.

The brominated epoxy-containing flame retardant as the component (B) preferably has the structure of the formula (II) and/or the formula (III) below.

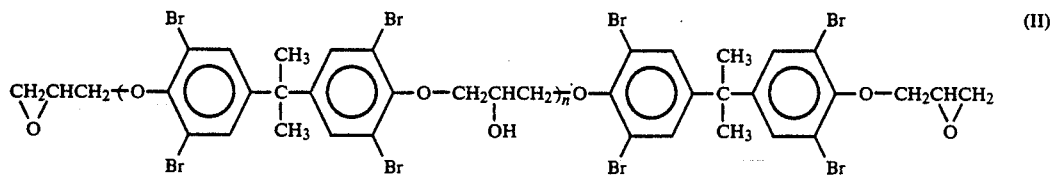

wherein n is a number of from 3 to 50.

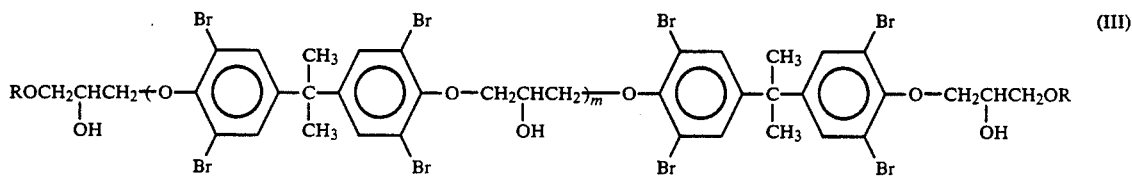

wherein n is as defined above, and R is an alkyl group having 4 to 20 carbon atoms, an optionally substituted aromatic hydrocarbon group having 6 to 20 carbon atoms or a halogen-substituted aromatic group having 6 to 20 carbon atoms.

The amount of the above flame retardant is 4 to 25% by weight. When this amount is less than 4% by weight, the resultant composition shows insufficient flame retardancy. When it is more than 25% by weight, the flame retardant is poorly dispersed, and undesirably, the resin composition shows poor extrusion properties and poor moldability and gives a molded article having decreased strength. Other brominated flame retardant may be incorporated in such an amount that the properties of the resin composition are not impaired.

The component (C) is a flame retardant aid composed mainly of at least one of antimony trioxide and antimony pentoxide.

As the above flame retardant aid, preferred is $Sb_2O_3$ and/or $xNa_2O \cdot Sb_2O_5 \cdot yH_2O$ ($x=0-1$, $y=0-4$), and more preferred is:

$$(Na_2O)_p \cdot Sb_2O_5 \cdot qH_2O \quad (I)$$

wherein p is a number of from 0.4 to 1.0 and q is a number of from 0 to 4 which shows an amount of water of crystallization. The flame retardant aid is incorporated to improve the flame retardancy effect. Although not specially limited, the particle diameter of the flame retardant aid is preferably 0.02 to 5 μm. The flame retardant aid may be surface-treated with any one of an epoxy compound, a silane compound, an isocyanate compound and a titanate compound. The amount of the flame retardant aid is 2 to 15% by weight. When the amount of the flame retardant aid is less than 2% by weight, the amount of the flame retardant required for rendering the composition flame-retardant increases, and as a result, the strength of the resultant molded article disadvantageously shows a decrease in strength. When the above amount is more than 15% by weight, undesirably, the decomposition of the resin or other additives is promoted to decrease the strength of the resultant molded article.

The component (D) is a polytetrafluoroethylene resin prepared by an emulsion polymerization method. This resin is used to decrease the burr formation. The particle size of this resin is preferably 0.05 to 0.5 μm as a primary particle size. Further, as far as the effect of decreasing the burr formation is not hampered, a small amount of a monomer such as perfluoroalkylvinyl ether may be incorporated when the resin is polymerized. The amount of the polytetrafluoroethylene resin is 0.05 to 10% by weight. When this amount is less than 0.05% by weight, there is no effect on a decrease in the burr formation. When it is more than 10% by weight, the fluidity of the resultant composition is impaired.

The above composition of the present invention can be easily produced by means of known facilities and a known method generally used for producing conventional resin compositions. Specific examples of these are as already specified in the present specification.

The flame-retardant resin composition of the present invention, obtained as described above, has excellent flame retardancy and fluidity, causes no bleedout of a flame retardant onto a molded article surface, and has an advantage that a finish step of deburring or the like, can be omitted since little burr is formed. The flame-retardant resin composition of the present invention therefore has a high industrial value, and can be applied to electrical and electronic parts such as a relay part, a connector part, a switch part and a condenser part, a variety of housings, and automobile parts such as a frame, a gear and a steering wheel.

The present invention will be explained by reference to Examples hereinafter.

The properties described herein were measured as follows.

(1) Concentration of terminal carboxyl group

Equivalent weight per $10^6$ g, measured by the method of A. Conix [Makromol. Chem. 26, 226 (1958)]

(2) Intrinsic viscosity

Measured in an o-chlorophenol solution at 35° C.

(3) Combustion test (UL-94)

Five test pieces (thickness; 1/32 inch) from each sample were tested according to the subject 94 (UL-94) method of Underwriters Laboratories.

(4) Method of evaluation of contamination to metal

A sample (pellets) was fully dried, then 50 g of the pellets were enclosed in a glass container together with a silver plate (15 mm×2 mm×0.2 mm) and the container was sealed. The pellets were heated at 200° C. for 200 hours, and then the silver plate was observed on its discolored state.

(5) Generation of decomposition gas (volatile gas)

10 Grams of sample pellets were placed in an H.S. (head space) container (27 ml), and after the container was tightly closed with a stopper, the sample pellets were heated with an H.S. heater at 150° C. for 60 minutes. A generated gas was quantitatively determined by gas chromatography.

(6) Amount of generated Br $5.0 \pm 0.1$ Grams of pellets were placed in a vial (20 ml) heated up to 200° C. in a gear aging tester, and heated at 300° C. for 1 hour. Then, the vial was allowed to stand at room temperature for 1 hour, then 5 ml of ion-exchanged water was added to the pellets, and the resultant mixture was fully stirred. This extraction water was subjected to ion chromatography to determine a Br amount.

(7) Fluidity

The length value of a bar flow having a thickness of 0.7 mm and a width of 10 mm was measured. (A bar flow length is the length of a test piece which is made in a state of short shot for the purpose of evaluating the fluidity of the resin. The larger the length is, the higher the fluidity is.) The molding conditions were that the cylinder temperature was 280° C., the mold temperature was 80° C., the injection pressure was 350 kgf/cm$^2$ (200 kgf/cm$^2$ when no inorganic filler was added) and the injection rate was 100 mm/sec.

(8) Tensile strength

Measured according to ASTM D-638.

(9) Evaluation on burr

A length value of a bar flow having a thickness of 0.05 mm was taken as a burr of a molded article, and compared with the length of a bar flow having a thickness of 0.5 mm to determine a burr index. The molding conditions were that the cylinder temperature was 280° C., the mold temperature was 80° C., the injection pressure was 450 kgf/cm$^2$ and the injection rate was 100 mm/sec. The smaller the index is, the smaller the burr formation degree is.

Burr index = (length of bar flow having a thickness of 0.05 mm)/(length of bar flow having a thickness of 0.5 mm) × 100

EXAMPLE 1

PBN having an intrinsic viscosity of 0.73 and a terminal carboxyl group concentration of 23 equivalents/ton was injection-molded to prepare test pieces for a bending test. These test pieces were deteriorated in hot water at 100° C. for 200 hours or at 100° C. for 600 hours and then measured for flexural strength. Table 1 shows the results.

EXAMPLE 2

Example 1 was repeated except that the PBN was replaced with PBN having an intrinsic viscosity of 0.84 and a terminal carboxyl group concentration of 41 equivalents/ton.

COMPARATIVE EXAMPLE 1

Example 1 was repeated except that the PBN was replaced with PBT having an intrinsic viscosity of 0.84 and a terminal carboxyl group concentration of 16 equivalents/ton.

COMPARATIVE EXAMPLE 2

Example 1 was repeated except that the PBN was replaced with PBT having an intrinsic viscosity of 0.92 and a terminal carboxyl group concentration of 62 equivalents/ton.

TABLE 1

| Example | Polymer | Terminal COOH concentration (eq/ton) | Flexural strength (kg/cm$^2$) | | |
|---|---|---|---|---|---|
| | | | Before hot water treatment | After 200 hours' hot water treatment | After 600 hours' hot water treatment |
| Ex. 1 | PBN | 23 | 840 | 830 | 580 |
| Ex. 2 | PBN | 41 | 840 | 810 | 510 |
| CEx. 1 | PBT | 16 | 860 | 810 | 310 |
| CEx. 2 | PBT | 62 | 870 | 820 | 250 |

Table 1 shows that PBN and PBT do not show much difference when treated with hot water for 200 hours, but that PBT greatly deteriorates when treated for 600 hours.

When PBN (Example 2) having a high terminal carboxyl group concentration (41 equivalents/ton) and PBT (Comparative Example 1) having a low terminal carboxyl group concentration (16 equivalents/ton) are compared with each other, it is understood that PBN is clearly excellent over PBT in the strength after 600 hours' hot water treatment.

EXAMPLES 3-5 AND COMPARATIVE EXAMPLES 3-6

Samples for evaluations were prepared from PBN having an intrinsic viscosity of 0.88 and PBT having an intrinsic viscosity of 0.90 by the following methods.

(1) Compounding

When a glass fiber, a flame retardant (brominated polycarbonate), Sb$_2$O$_3$, etc., were incorporated, these components in amounts shown in Table 2 were preliminarily dry-blended with PBN or PBT. After the resultant blends were respectively melt-kneaded in a twin-screw extruder, the threads of them were cooled, and then pelletized.

(2) Molding

PBN and PBT pellets containing no additive and pellets compounded in the above (1) were respectively injection-molded to prepare test pieces for a UL-94 combustion test.

Table 2 shows the properties of these materials.

TABLE 2

| No. | Polymer Kind | Polymer wt. % | Glass fiber wt. % | Brominated PC* wt. % | Sb$_2$O$_3$ wt. % | UL-94 | Contamination to metal Discoloration of Ag plate | Decomposition gas ppm | Amount of Br ppm |
|---|---|---|---|---|---|---|---|---|---|
| Ex. 3 | PBN | 100.0 | — | — | — | — | No | 29.4 | — |
| CEx. 3 | PBT | 100.0 | — | — | — | — | slightly | 48.5 | — |
| Ex. 4 | PBN | 85.0 | — | 10.0 | 5.0 | V-0 | No | 8.1 | 319 |
| CEx. 4 | PBT | 76.0 | — | 17.0 | 7.0 | V-0 | discolored | 22.3 | 2,160 |
| Ex. 5 | PBN | 59.5 | 30.0 | 7.0 | 3.5 | V-0 | slightly | 5.7 | 143 |

TABLE 2-continued

| No. | Polymer Kind | Polymer wt. % | Glass fiber wt. % | Brominated PC* wt. % | Sb$_2$O$_3$ wt. % | UL-94 — | Contamination to metal Discoloration of Ag plate | Decomposition gas ppm | Amount of Br ppm |
| --- | --- | --- | --- | --- | --- | --- | --- | --- | --- |
| CEx. 5 | PBT | 52.0 | 30.0 | 13.0 | 5.0 | V-0 | discolored discolored | 18.6 | 1,562 |
| CEx. 6 | PET | 55.0 | 30.0 | 11.0 | 4.0 | V-0 | discolored | 35.2 | 536 |

*polycarbonate

EXAMPLE 6

Mixed with PBN having an intrinsic viscosity of 1.02 were 16% by weight of a brominated epoxy flame retardant having an average polymerization degree of about 15 (terminated with glycidyl) and 8% by weight of antimony trioxide. The resultant mixture was melt-kneaded.

TABLE 3

| Contents | Unit | Ex. 6 | Ex. 7 | Ref. Ex. 1 | Ref. Ex. 2 | Ref. Ex. 3 |
| --- | --- | --- | --- | --- | --- | --- |
| Composition | | | | | | |
| (A) Polymer | | | | | | |
| PBN | wt. % | 75.0 | 75.0 | 76.0 | 75.0 | 76.0 |
| (B) Flame retardant | | | | | | |
| Brominated epoxy | | | | | | |
| B-1 | " | 16.0 | — | — | — | 16.0 |
| B-2 | " | — | 16.0 | — | — | — |
| Brominated polycarbonate | " | — | — | 16.0 | 16.0 | — |
| (C) Antimony trioxide | " | 8.0 | 8.0 | 8.0 | 8.0 | 8.0 |
| (D) PTFE | " | 1.0 | 1.0 | — | 1.0 | — |
| Physical properties | | | | | | |
| Fluidity (Bar flow length) | mm | 88 | 89 | 65 | 63 | 92 |
| Tensile strength | kg/cm$^2$ | 680 | 680 | 700 | 680 | 680 |
| Combustion test (UL-94) | — | V-0 | V-0 | V-0 | V-0 | V-0 |
| Burr evaluation (Burr index) | — | 2.3 | 2.2 | 5.0 | 2.4 | 4.8 |

B-1: terminated with glycidyl
B-2: terminated with tert-butylphenyl
PTFE: polytetrafluoroethylene resin prepared by an emulsion polymerization method.

dant having an average polymerization degree of about 15 (terminated with glycidyl), 8% by weight of antimony trioxide and 1% by weight of a polytetrafluoroethylene resin prepared by an emulsion polymerization method, and the resultant mixture was melt-kneaded. The resultant composition was measured for its properties according to the above measurement methods (1) to (4). Table 3 shows the results.

EXAMPLE 7

Example 6 was repeated except that the flame retardant was replaced with a brominated epoxy flame retardant having an average polymerization degree of about 15 (terminated with t-butylphenyl).

REFERENTIAL EXAMPLE 1

Mixed with PBN having an intrinsic viscosity of 1.02 were 16% by weight of brominated polycarbonate having an average polymerization degree of about 6 and 8% by weight of antimony trioxide. The resultant mixture was melt-kneaded.

REFERENTIAL EXAMPLE 2

Mixed with PBN having an intrinsic viscosity of 1.02 were 16% by weight of brominated polycarbonate having an average polymerization degree of about 6, 8% by weight of antimony trioxide and 1% by weight of a polytetrafluoroethylene resin prepared by an emulsion polymerization method. The resultant mixture was melt-kneaded.

REFERENTIAL EXAMPLE 3

Mixed with PBN having an intrinsic viscosity of 1.02 were 16% by weight of a brominated epoxy flame retardant having an average polymerization degree of about 15 (terminated with glycidyl) and 8% by weight of antimony trioxide. The resultant mixture was melt-kneaded.

Table 3 clearly shows that a composition which has high fluidity and causes little burr can be obtained only when it contains a brominated epoxy as a flame retardant and a polytetrafluoroethylene resin prepared by an emulsion polymerization method. It also makes it clear that the effect remains unchanged even if the flame retardant is replaced with a brominated epoxy flame retardant having terminal tert-butylphenyl groups.

EXAMPLE 8

Mixed with PBN having an intrinsic viscosity of 0.88 were 30% by weight of a glass fiber, 12% by weight of a brominated epoxy flame retardant having an average polymerization degree of about 15 (terminated with glycidyl), 6% by weight of antimony trioxide and 1% by weight of a polytetrafluoroethylene resin prepared by an emulsion polymerization method, and the resultant mixture was melt-kneaded. Table 4 shows the results of the physical property measurements of the resultant composition.

EXAMPLE 9

Example 8 was repeated except that 20% by weight of a glass fiber and 20% by weight of mica were used as inorganic fillers.

REFERENTIAL EXAMPLE 4

Mixed with PBN having an intrinsic viscosity of 0.88 were 30% by weight of a glass fiber, 12% by weight of brominated polycarbonate having an average polymerization degree of about 6 and 6% by weight of antimony trioxide, and the resultant mixture was melt-kneaded.

REFERENTIAL EXAMPLE 5

Mixed with PBN having an intrinsic viscosity of 0.88 were 30% by weight of a glass fiber, 12% by weight of brominated polycarbonate having an average polymerization degree of about 6, 6% by weight of antimony trioxide and 1% by weight of a polytetrafluoroethylene resin prepared by an emulsion polymerization method, and the resultant mixture was melt-kneaded.

REFERENTIAL EXAMPLE 6

Mixed with PBN having an intrinsic viscosity of 0.88 were 30% by weight of a glass fiber, 12% by weight of a brominated epoxy flame retardant having an average polymerization degree of about 15 (terminated with glycidyl) and 6% by weight of antimony trioxide, and the resultant mixture was melt-kneaded.

EXAMPLE 10

Example 8 was repeated except that the amount of a polytetrafluoroethylene resin prepared by an emulsion polymerization method was changed to 0.05% by weight.

EXAMPLE 11

Example 8 was repeated except that the amount of a polytetrafluoroethylene resin prepared by an emulsion polymerization method was changed to 0.3% by weight.

EXAMPLE 12

Example 8 was repeated except that the amount of a polytetrafluoroethylene resin prepared by an emulsion polymerization method was changed to 15% by weight.

TABLE 4

| Contents | Unit | Ex. 8 | Ex. 9 | Ref. Ex. 4 | Ref. Ex. 5 | Ref. Ex. 6 |
| --- | --- | --- | --- | --- | --- | --- |
| Composition | | | | | | |
| (A) Polymer | | | | | | |
| PBN | wt. % | 51.0 | 41.0 | 52.0 | 51.0 | 52.0 |
| (B) Flame retardant | | | | | | |
| Brominated epoxy | " | 12.0 | 12.0 | — | — | 12.0 |
| Brominated polycarbonate | " | — | — | 12.0 | 12.0 | — |
| (C) Antimony trioxide | " | 6.0 | 6.0 | 6.0 | 6.0 | 6.0 |
| (D) PTFE | " | 1.0 | 1.0 | — | 1.0 | — |
| (E) Inorganic filler | | | | | | |
| Glass fiber | " | 30.0 | 20.0 | 30.0 | 30.0 | 30.0 |
| Mica | " | — | 20.0 | — | — | — |
| Physical properties | | | | | | |
| Fluidity (Bar flow length) | mm | 65 | 60 | 44 | 44 | 66 |
| Tensile strength | kg/cm² | 1340 | 1200 | 1350 | 1360 | 1290 |
| Combustion test (UL-94) | — | V-0 | V-0 | V-0 | V-0 | V-0 |
| Burr evaluation (Burr index) | — | 1.3 | 1.5 | 3.8 | 1.6 | 3.6 |

Table 4 shows that the effect of the present invention remains unchanged even when an inorganic filler is incorporated.

REFERENTIAL EXAMPLE 7

Example 8 was repeated except that the amount of a polytetrafluoroethylene resin prepared by an emulsion polymerization method was changed to 0.02% by weight.

REFERENTIAL EXAMPLE 9

Example 8 was repeated except that the amount of a polytetrafluoroethylene resin prepared by an emulsion polymerization method was changed to 15% by weight.

REFERENTIAL EXAMPLE 9

Example 8 was repeated except that the polytetrafluoroethylene resin prepared by an emulsion polymerization method was replaced with a polytetrafluoroethylene resin prepared by a suspension polymerization method.

TABLE 5

| Contents | Unit | Ref. Ex. 7 | Ex. 10 | Ex. 11 | Ex. 12 | Ref. Ex. 8 | Ref. Ex. 9 |
| --- | --- | --- | --- | --- | --- | --- | --- |
| Composition | | | | | | | |
| (A) Polymer | | | | | | | |
| PBN | wt. % | 51.98 | 51.95 | 51.7 | 47.0 | 37.0 | 51.0 |
| (B) Flame retardant | | | | | | | |
| Brominated epoxy | " | 12.0 | 12.0 | 12.0 | 12.0 | 12.0 | 12.0 |
| (C) Antimony trioxide | " | 6.0 | 6.0 | 6.0 | 6.0 | 6.0 | 6.0 |
| (D) PTFE | | | | | | | |
| D-1 | " | 0.02 | 0.05 | 0.3 | 5.0 | 15.0 | — |
| D-2 | " | — | — | — | — | — | 1.0 |
| (E) Inorganic filler | | | | | | | |
| Glass fiber | " | 30.0 | 30.0 | 30.0 | 30.0 | 30.0 | 30.0 |
| Physical properties | | | | | | | |
| Fluidity (Bar flow length) | mm | 68 | 68 | 67 | 63 | 42 | 67 |
| Tensile strength | kg/cm² | 1350 | 1360 | 1350 | 1360 | 1330 | 1340 |
| Combustion test (UL-94) | — | V-0 | V-0 | V-0 | V-0 | V-0 | V-0 |

TABLE 5-continued

| Contents | Unit | Ref. Ex. 7 | Ex. 10 | Ex. 11 | Ex. 12 | Ref. Ex. 8 | Ref. Ex. 9 |
|---|---|---|---|---|---|---|---|
| Burr evaluation (Burr index) | — | 3.4 | 1.8 | 1.4 | 1.3 | 1.3 | 3.7 |

D-1: emulsion polymerization product
D-2: suspension polymerization product

Table 5 shows that there is no effect on decreasing burr when the amount of the polytetrafluoroethylene resin prepared by an emulsion polymerization method is less than 0.05% by weight and that the fluidity of the composition is impaired when the above amount is more than 10% by weight. Further, a polytetrafluoroethylene resin prepared by a suspension polymerization method produces almost no effect on decreasing burr.

REFERENTIAL EXAMPLE 10

Example 8 was repeated except that the amount of a brominated epoxy flame retardant was changed to 2% by weight and that the amount of antimony trioxide was changed to 4% by weight. Table 6 shows the results.

REFERENTIAL EXAMPLE 11

Example 8 was repeated except that the amount of a brominated epoxy flame retardant was changed to 4% by weight and that the amount of antimony trioxide was changed to 1% by weight.

EXAMPLE 13

Referential Example 10 was repeated except that the amount of a brominated epoxy flame retardant was changed to 5% by weight.

EXAMPLE 14

Referential Example 10 was repeated except that the amount of a brominated epoxy flame retardant was changed to 20% by weight.

REFERENTIAL EXAMPLE 12

Referential Example 10 was repeated except that the amount of a brominated epoxy flame retardant was changed to 30% by weight.

REFERENTIAL EXAMPLE 13

Example 8 was repeated except that the amount of antimony trioxide was changed to 20% by weight.

and flame retardant aid are small and since the strength decreases when the above amounts are too large.

EXAMPLE 15

Example 8 was repeated except that 8% by weight of $Sb_2O_5.2H_2O$ was used as a flame retardant aid. Table 7 shows the results.

EXAMPLE 16

Example 8 was repeated except that 8% by weight of $(Na_2O)_{0.75}.Sb_2O_5$ was used as a flame retardant aid.

EXAMPLE 17

Example 8 was repeated except that 8% by weight of $Na_2O.Sb_2O_5$ was used as a flame retardant aid.

TABLE 7

| Contents | Unit | Ex. 15 | Ex. 16 | Ex. 17 |
|---|---|---|---|---|
| Composition | | | | |
| (A) Polymer | | | | |
| PBN | wt. % | 49.0 | 49.0 | 49.0 |
| (B) Flame retardant | | | | |
| Brominated epoxy | " | 12.0 | 12.0 | 12.0 |
| (C) Flame retardant aid | | | | |
| $Sb_2O_5.2H_2O$ | " | 8.0 | — | — |
| $(Na_2O)_{0.75}.Sb_2O_5$ | " | — | 8.0 | — |
| $Na_2O.Sb_2O_5$ | " | — | — | 8.0 |
| (D) PTFE | " | 1.0 | 1.0 | 1.0 |
| (E) Inorganic filler | | | | |
| Glass fiber | " | 30.0 | 30.0 | 30.0 |
| Physical properties | | | | |
| Fluidity (Bar flow length) | mm | 61 | 61 | 59 |
| Tensile strength | kg/cm² | 1300 | 1310 | 1310 |
| Combustion test (UL-94) | — | V-0 | V-0 | V-0 |
| Burr evaluation (Burr index) | — | 1.4 | 1.5 | 1.5 |

Table 7 shows that the effect of the present invention remains unchanged even if a flame retardant aid comprising antimony pentoxide is used as a flame retardant aid.

TABLE 6

| Contents | Unit | Ref. Ex. 10 | Ref. Ex. 11 | Ex. 13 | Ex. 14 | Ref. Ex. 12 | Ref. Ex. 13 |
|---|---|---|---|---|---|---|---|
| Composition | | | | | | | |
| (A) Polymer | | | | | | | |
| PBN | wt. % | 63.0 | 64.0 | 60.0 | 45.0 | 35.0 | 37.0 |
| (B) Flame retardant | | | | | | | |
| Brominated epoxy | " | 2.0 | 4.0 | 5.0 | 20.0 | 30.0 | 12.0 |
| (C) Antimony trioxide | " | 4.0 | 1.0 | 4.0 | 4.0 | 4.0 | 20.0 |
| (D) PTFE | " | 1.0 | 1.0 | 1.0 | 1.0 | 1.0 | 1.0 |
| (E) Inorganic filler | | | | | | | |
| Glass fiber | " | 30.0 | 30.0 | 30.0 | 30.0 | 30.0 | 30.0 |
| Physical properties | | | | | | | |
| Fluidity (Bar flow length) | mm | 54 | 58 | 62 | 68 | 71 | 58 |
| Tensile strength | kg/cm² | 1420 | 1440 | 1360 | 1300 | 1180 | 1160 |
| Combustion test (UL-94) | — | HB | HB | V-0 | V-0 | V-0 | V-0 |
| Burr evaluation (Burr index) | — | 2.2 | 2.1 | 1.5 | 1.3 | 1.2 | 2.5 |

Table 6 shows that the amount of the flame retardant is required to be 4 to 25% by weight and that the amount of the flame retardant aid is required to be 2 to 15% by weight since no sufficient flame retardancy can be obtained when the amounts of the flame retardant aid.

EXAMPLE 18

Example 8 was repeated except that a mixture of 70% by weight of polybutylene naphthalene-dicarboxylate having an intrinsic viscosity of 0.88 and 30 parts by weight of polyethylene terephthalate having an intrinsic viscosity of 0.70 was used as a thermoplastic polyester resin. Table 8 shows the results.

EXAMPLE 19

Example 8 was repeated except that a polybutylene naphthalenedicarboxylate copolymer having an intrinsic viscosity of 0.88, obtained by using 15 mol % of isophthalic acid as a comonomer, was used as a thermoplastic polyester resin.

EXAMPLE 20

Example 8 was repeated except that a mixture of 70 parts by weight of polybutylene naphthalenedicarboxylate having an intrinsic viscosity of 0.88 and 30 parts by weight of polycarbonate (L1225, supplied by Teijin Chemicals, Ltd) was used as a thermoplastic polyester resin.

EXAMPLE 21

Example 8 was repeated except that a mixture of 70 parts by weight of polybutylene naphthalenedicarboxylate having an intrinsic viscosity of 0.88 and 30 parts by weight of polybutylene terephthalate having an intrinsic viscosity of 0.90 was used as a thermoplastic polyester resin.

TABLE 8

| Contents | Unit | Ex. 18 | Ex. 19 | Ex. 20 | Ex. 21 |
|---|---|---|---|---|---|
| Composition | | | | | |
| (A) Polymer | | | | | |
| PBN/PET = 70/30 mixture | wt. % | 51.0 | — | — | — |
| Isophthalic acid 15 mol % copolymerized PBN copolymer | " | — | 51.0 | — | — |
| PBN/PC = 70/30 mixture | " | — | — | 51.0 | — |
| PBN/PBT = 70/30 mixture | " | — | — | — | 51.0 |
| (B) Flame retardant | | | | | |
| Brominated epoxy | " | 12.0 | 12.0 | 12.0 | 12.0 |
| (C) Antimony trioxide | " | 6.0 | 6.0 | 6.0 | 6.0 |
| (D) PTFE | " | 1.0 | 1.0 | 1.0 | 1.0 |
| (E) Inorganic filler | | | | | |
| Glass fiber | " | 30.0 | 30.0 | 30.0 | 30.0 |
| Physical properties | | | | | |
| Fluidity (Bar flow length) | mm | 61 | 62 | 60 | 57 |
| Tensile strength | kg/cm$^2$ | 1300 | 1300 | 1310 | 1350 |
| Combustion test (UL-94) | — | V-0 | V-0 | V-0 | V-0 |
| Burr evaluation (Burr index) | — | 1.3 | 1.5 | 1.6 | 1.6 |

Table 8 shows that not only the effect of the present invention can be obtained when a PBN homopolymer is used, but also the effect of the present invention remains unchanged even if a PBN copolymer or a thermoplastic polyester resin mixture composed mainly of PBN is used as a thermoplastic polyester resin.

What is claimed is:

1. An electrical or electronic part formed from a polybutylene naphthalenedicarboxylate resin as a raw material.

2. The electrical or electronic part of claim 1, wherein the polybutylene naphthalenedicarboxylate is polybutylene-2,6-naphthalenedicarboxylate.

3. The electrical or electronic part of claim 1, wherein said part is a coil bobbin, a condensor case, an IC carrier, a plug, a socket or a fuse case.

4. An electrical part formed from a resin composition, wherein said composition comprises
   (A) a polybutylene naphthalenedicarboxylate resin,
   (B) a brominated flame retardant, and
   (C) a flame retardant aid comprising as a main component at least one of antimony trioxide and antimony pentoxide.

5. The electrical part of claim 4, wherein the resin composition contains not more than 25% by weight of the brominated flame retardant (B) and not more than 15% by weight of the flame retardant aid (C).

6. The electrical part of claim 4, wherein the resin composition further contains not more than 70% by weight of an inorganic filler.

7. The electrical part of claim 4, wherein the polybutylene naphthalenedicarboxylate is polybutylene-2,6-naphthalenedicarboxylate.

8. The electrical part of claim 4, wherein said part is a relay part or a switch part.

9. A flame-retardant resin composition comprising
   (A) a resin or a resin mixture selected from the group consisting of a polybutylene naphthalenedicarboxylate resin, a copolyester resin in which the content of the total of a butylene group and a naphthalenedicarboxylate group is at least 60% by weight, and a resin mixture containing at least 60% by weight of polybutylene naphthalenedicarboxylate and the balance of other thermoplastic resin,
   (B) 4 to 25% by weight of a brominated epoxy-containing flame retardant,
   (C) 2 to 15% by weight of a flame retardant aid comprising as a main component at least one of antimony trioxide and antimony pentoxide, and
   (D) 0.05 to 10% by weight of a polytetrafluoroethylene resin prepared by an emulsion polymerization method.

10. The composition of claim 9, which further contains not more than 60% by weight of an inorganic filler.

11. The composition of claim 9, wherein the polybutylene naphthalenedicarboxylate is polybutylene-2,6-naphthalenedicarboxylate.

12. The composition of claim 9, wherein the flame retardant aid has the following formula (I), $$(Na_2O)_p \cdot Sb_2O_5 \cdot qH_2O \qquad (I)$$

wherein p is a number of from 0.4 to 1.0 and q is a number of from 0 to 4 which represents the amount of water of crystallization.

13. The composition according to claim 10 wherein the inorganic filler comprises a combination of glass fiber and at least one of particulate and plate-like filler.

14. The composition according to claim 9 wherein the polytetrafluoroethylene resin (D) has a particle size of from 0.05 to 0.5 μm.

15. The composition according to claim 9 wherein the flame retardant aid (C) has a particle diameter of from 0.02 to 5.0 μm.

16. The electrical or electronic part according to claim 4 wherein the brominated flame retardant (B) is selected from the group consisting of brominated bisphenol A polycarbonate flame retardant having a bromine content of at least 20%, brominated bisphenol A type epoxy resin having all or part of the terminal glycidyl groups blocked, brominated diphenyl ether flame retardant, brominated imide flame retardant, and brominated polystyrene flame retardant.

17. The flame-retardant resin composition according to claim 9 wherein the amount of brominated epoxy-containing flame retardant is in the range of from about 5 to about 20 wt %, the amount of flame retardant aid is in the range of from about 3.5 to about 8 wt % and the amount of polytetrafluorethylene is in the range of from about 1.0 to 5 wt %.

* * * * *